United States Patent
Manassen et al.

(10) Patent No.: US 8,681,413 B2
(45) Date of Patent: Mar. 25, 2014

(54) ILLUMINATION CONTROL (75) Inventors: Amnon Manassen, Haifa (IL); Joel Seligson, Misgav (IL); Noam Sapiens, Bat Yam (IL)

(73) Assignee: KLA-Tencor Corporation, Milpitas, CA (US)

( * ) Notice: Subject to any disclaimer, the term of this patent is extended or adjusted under 35 U.S.C. 154(b) by 312 days.

(21) Appl. No.: 13/170,025

(22) Filed: Jun. 27, 2011

(65) Prior Publication Data

US 2012/0327503 A1    Dec. 27, 2012

(51) Int. Cl.
*G02B 26/00* (2006.01)
*G02B 26/08* (2006.01)

(52) U.S. Cl.
USPC ............ 359/291; 359/198; 359/223; 359/237

(58) Field of Classification Search
USPC ................. 359/290–292, 295, 223–225, 245, 359/260–263, 298, 198, 301–303, 317–318, 359/237, 242
See application file for complete search history.

(56) References Cited

U.S. PATENT DOCUMENTS

| | | | |
|---|---|---|---|
| 6,023,338 A | 2/2000 | Bareket | |
| 6,462,818 B1 | 10/2002 | Bareket | |
| 6,486,954 B1 | 11/2002 | Mieher | |
| 6,844,927 B2 * | 1/2005 | Stokowski et al. | ........ 356/237.1 |
| 7,009,704 B1 | 3/2006 | Nikoonahad | |
| 7,155,018 B1 | 12/2006 | Pham | |
| 7,791,732 B2 | 9/2010 | Den Boef | |
| 2004/0130561 A1 | 7/2004 | Jain | |
| 2008/0239428 A1* | 10/2008 | Bell et al. | ......................... 359/30 |
| 2012/0123581 A1* | 5/2012 | Smilde et al. | .................. 700/105 |

FOREIGN PATENT DOCUMENTS

| | | |
|---|---|---|
| JP | 2010525589 A | 7/2010 |
| KR | 20070087507 A | 8/2007 |
| KR | 20100107014 A | 10/2010 |
| WO | 2010100078 A | 9/2010 |
| WO | 2011012624 | 2/2011 |

OTHER PUBLICATIONS

PCT International Search Report mailed date Feb. 28, 2013 issued for PCT International Application No. PCT/US2012/041273.

* cited by examiner

*Primary Examiner* — Dawayne A Pinkney
(74) *Attorney, Agent, or Firm* — Joshua D. Isenberg; JDI Patent (57) ABSTRACT

An optical system may include an objective, a source of illumination, an illumination system having illumination optics configured to direct the illumination onto the objective, and at least two dynamic optical array devices located at a pupil conjugate plane and a field conjugate plane, respectively in the illumination optics. The dynamic optical array devices are configured to control one or more properties of illumination coupled from the illumination system to the objective.

42 Claims, 5 Drawing Sheets

ILLUMINATION CONTROL

FIELD OF THE INVENTION

Embodiment of this invention generally relates to optical overlay metrology and more particularly to control of illumination optics in an overlay system.

BACKGROUND OF THE INVENTION

Lithography is a key factor in the drive for higher levels of microcircuit integration. Dynamic RAMs have quadrupled in the level of integration every three years as a result of the reduction in minimum geometries and increases in chip size. As minimum geometries become smaller, alternatives to optical lithography, such as electron beam direct write, X-ray and electron/ion beam proximity technologies become attractive. The latter three technologies are still in their infancy relative to optical lithography and still have obstacles to overcome, including decreased throughput, low source brightness and mask complexity, respectively.

While optical lithography continues to be the dominant technology because it is well established and is capable of implementing sub-micron resolution at least as low as 0.35 micron, efforts into attaining smaller geometries are looking toward the newer technologies. In both optical lithography and its alternatives, progress into the realm of shorter wavelengths introduces increased sensitivities to minute surface imperfections including contaminants on optical surfaces, aberrations introduced by lenses and mirrors, photoresist thickness and surface variations and wafer flatness and planarity.

Due to manufacturing limitations most optical elements have plane, spherical or paraboloidal form. The restriction to surfaces of simple form imposes limitations in an optical system's ability to realize diffraction-limited performance due to optical aberrations.

In optical machine vision devices great attention is usually given to the quality of the optics between the observed target and detector. In semiconductor metrology this is particularly true as the optics is expected to have as little error contribution to the measured signal as possible. In the optics optimization process, standard optics analysis methods are usually employed where an ideal simulated ray cone is launched from points on a target towards a detector while the intermediate optics are improved to achieve the best converging ray cone at the detector. The best possible cone at the detector will produce a diffraction limited Airy disk, which is a diffraction pattern resulting from a uniformly-illuminated circular aperture having a bright region in the center.

The point spread function (PSF) describes the response of an imaging system to a point source or point object. The degree of spreading (blurring) of the point object in the image is a measure for the quality of an imaging system. Reduced quality cone can be described with a Point Spread Function (PSF), i.e., the converging cone quality is limited by the optics aberrations. It is assumed that illumination optics is perfect and that the ray bundle emanating from the target, as a result of illumination reflection, towards the detector is also perfect, i.e., suffers no aberration or diffraction at its origin. While this is an excellent assumption in many cases, it falls short when measuring deeply sub-wavelength features. Traditional methods for improving illumination include illumination optics optimization and the use of static and dynamic diffusers. However, improved illumination optics cannot always compensate for imperfect light source and the use of diffusers relies on their random nature, thus, support limited control over illumination quality. Here a dynamic method is proposed which includes 2 structured elements, one in field conjugate and one in pupil conjugate which enables control on illumination spatial and angular characteristics.

An important metrology technique used in semiconductor manufacturing is the measurement of overlay error between successive patterned layers on a wafer. Overlay metrology is one of the most critical process control techniques used in the manufacturing of integrated circuits and devices. Overlay accuracy generally pertains to the determination of how accurately a first patterned layer aligns with respect to a second patterned layer disposed above or below it and to the determination of how accurately a first pattern aligns with respect to a second pattern disposed on the same layer. Presently, overlay measurements are performed via test patterns that are printed together with layers of the wafer. The images of these test patterns are captured via an imaging tool and an analysis algorithm is used to calculate the relative displacement of the patterns from the captured images.

It is within this context that embodiments of the present invention arise.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the examples of embodiments of the invention described below are set forth without any loss of generality to, and without imposing limitations upon, the claimed invention.

The objective of traditional illumination methods is to deliver best possible illumination spot, in terms of spatial and angular distribution, to the target so that the illumination system contribution to the overall error will be limited. However, illumination source and optics can introduce aberrations that upon reflection from the target result in overall lower quality than the collection optics quality. And inversely, no attempt is made to compensate for collection optics flaws with illumination control. The assumption of perfect illumination can be challenged and the illumination system can be analyzed and optimized for improved performance.

In astronomical devices, where structured active elements, such as DLP, are used for atmospheric aberrations correction, the source of light can usually be regarded as a point source so there are no field distribution issues. Furthermore, the DLP chip is located in the collection optics, not the illumination optics.

Projectors use such devices in the field conjugate, where they serve as the object that is projected to the screen, but not in the pupil conjugate.

As most optical metrology devices are either reflection or transmission devices, the target can be considered as either a mirror or a window which means that, as a practical matters, the cone emanating from the target in traditional analysis is actually the resultant cone of the illumination system. Following this reasoning, the diffraction and aberrations of the illumination system ends up also in the collection channel that, as described above, is usually optimized independently. A preferred solution is to improve the illumination so it delivers a diffraction limited and aberration free spot to the measured target. However, as a typical illumination source is far from an ideal point source, calibration knobs, either static or dynamic can be added to control the illumination optics to optimize the delivered illumination spot. Considering the sequential propagation of light as described above, these knobs can actually be calibrated to introduce intentional aberrations into the illumination that are equal in magnitude and opposite in sign to collection channel aberrations and thus contribute to the system performance by making it effectively aberration free. Such a concept can enable working with optics of reduced quality and cost or support the effective optimization of a single optics to different applications, each having its unique optical requirements. If such an aberration knob were available, tricks like effective focusing can be attempted as well.

The concept described above can be extended to compensate for optics imperfections other than aberrations such as glass inhomogeneity, strae, bubbles, scratch-dig, roughness etc.

Other advantages can be achieved by controlling illumination. For example, the diameter of illumination spot in within the objective's pupil (in the case of Kohler illumination) has an affect on overlay. Controlling the diameter of illumination at the objective pupil with the knobs during the recipe porting can be used for tool matching. Furthermore, the intensity of illumination over a target or spot also can be controlled.

Furthermore, some targets have different layer or regions. Some layers (or regions) of the target can reflect well and others reflect poorly. In this case, the illumination can be controlled to different field positions so that the highly reflective parts receive less light and the poorly reflective parts receive more light. In addition, it would be desirable to control the light distribution in the pupil to optimize the angular distribution of light hitting the target at each field point. This selective field illumination could be helpful when measuring small targets, namely, illuminating only the part of the target that contains information and not its vicinity can reduce optical cross talk challenges. Here too, the illumination angular distribution toward the edge of the illuminated zone can be optimized.

According to a preferred embodiment of the present invention, an illumination aberration device may use micro-mirror arrays, such as currently available in projectors, to control the intensity distribution of target illumination. By way of example, and not by way of limitation, one could control the reflecting states of individual optical elements within an array of such elements so that for, e.g., 80% of the time a given element is in a retro-reflecting state that directs light away from the target and for 20% of the time it is in a tilted state that directs the light toward the target. The reflect state of a micro-mirror device can be controlled at a very high rate. Each such device can have thousands of individual controllable micro-mirrors and if located in both a pupil and field conjugates of the system, their mutual operation can provide any distribution of rays representing any aberration required.

It may be desirable in such a micro-mirror array for the physical mirror pixels to be smaller than the optical pixels by about a factor of 5. In such a case, the optics that collect the light manipulated by the micro-mirror array can have a point spread function that is about five times the size of a mirror pixel.

Figure 1:
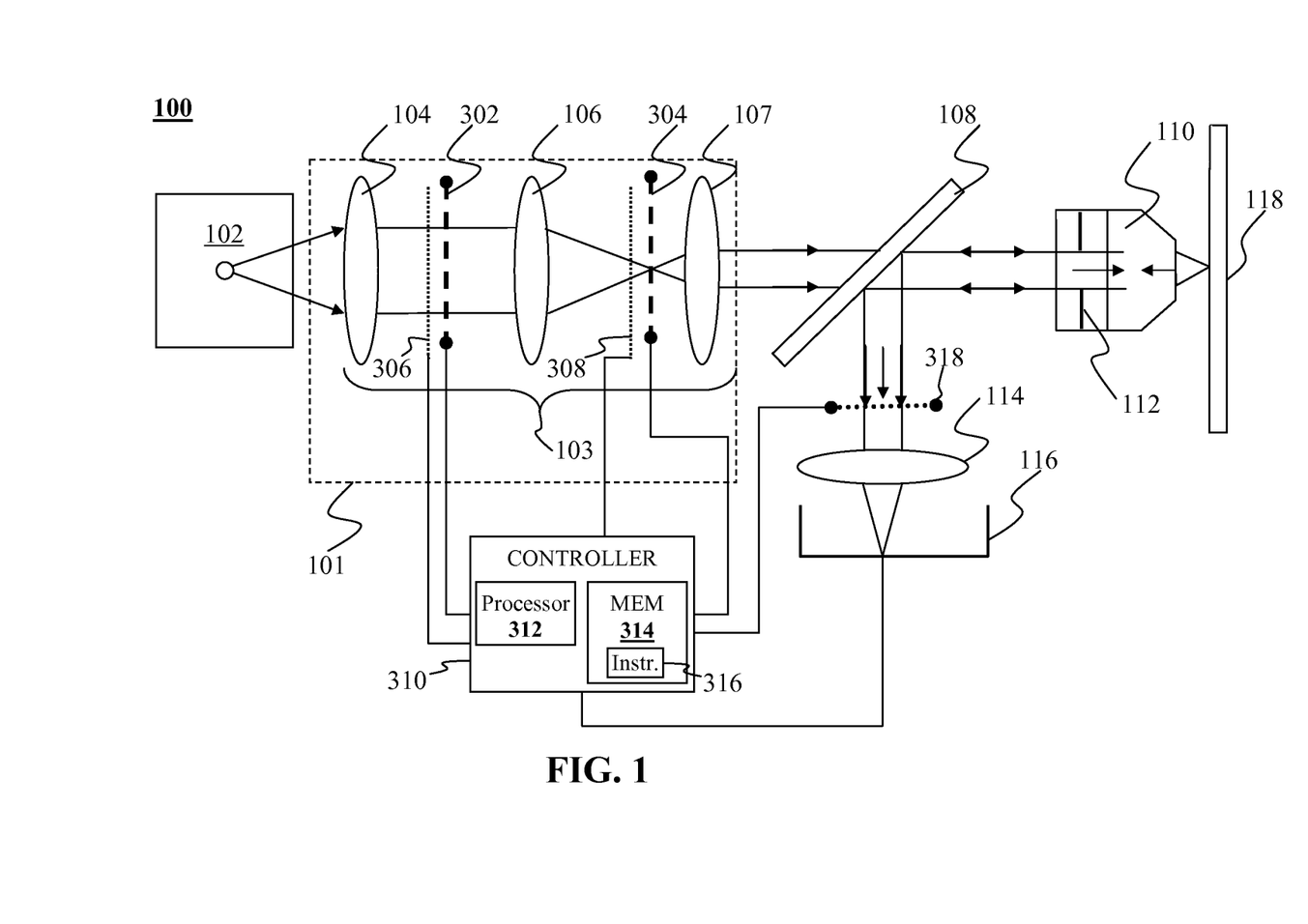
FIG. 1 is a schematic diagram illustrating a metrology apparatus according to an embodiment of the present invention.

FIG. 1 is a schematic diagram illustrating an optical apparatus 100 according to an embodiment of the present invention. As shown in FIG. 1, illumination source 102 produces a light beam of illumination that is coupled to illumination optics 101. The illumination from the source 101 may be electromagnetic radiation from any portion or portions of the electromagnetic spectrum, including, but not limited to infrared radiation, visible radiation, and ultraviolet radiation. By way of example, the illumination source 102 may include a monochromatic source of light, such as a laser or a broadband source, such as arc lamp or super continuum source.

The illumination source 102 may be a point source or nearly a point source of light. By way of example, the end of an optical fiber may be regarded as nearly a point source. Light form a primary source, such as a lamp or laser may be coupled into one end of a fiber, e.g., by suitable optical components, and light emerging from the other end may coupled to the illumination optics.

The source 102 may be tunable, or may contain adjustable or selectable filters, such that a wavelength or selected rang of wavelengths may be included or excluded from the incident light. The source 102 may also include polarization control elements such that a polarization state can be selected, possibly per wavelength. Incident light from the source 102 is collimated by a lens assembly 103 and illuminates the objective pupil 112 of the objective 110, which directs incident radiation at a feature or features on the sample 118. This light first passes through a lens assembly 103 including lenses 104, 106 and 107 before passing through a beam splitter 108 and arriving at the objective pupil 112 of the objective 110. The lens assembly 103 acts to direct light towards the objective pupil 112 of the objective 110.

The illumination optics 101 may include a lens assembly 103 having collimating lens 104 that converts diverging light from the source 102 into a parallel beam. A second lens 106 focuses the light. A first dynamic optical array device 302 located between the lenses 104 and 106. The light focused by the second lens 106 may be collimated by a third lens 107 and coupled to the objective 110. A second dynamic optical array device 304 may be located between the second and third lenses 106, 107 or near their mutual point of focus.

Incident radiation that reaches the feature on the sample 118 is scattered as both ordered scattered radiation and diffuse scattered radiation. This scattered radiation passes back through the objective pupil 112 of the objective 110 before reaching the beam splitter 108. The beam splitter 108 diverts some of the returning light towards a collection path. This diverted light passes through collection optics 114, which may include a relay lens that focuses the light towards a 2D array detector 116, e.g., a charge-coupled device (CCD), or a position sensitive detector (PSD) converts the optical signal of the returning light into an electric signal to be further processed by a controller.

In some cases there are unneeded diffraction orders in the pupil image that have relatively high intensity. This might cause dynamic range issues in the detector 116 and would likely contribute to noise in the detector. Unneeded diffraction orders are normally filtered out of the image captured by the detector 116 in software. However, software filtering of the image does not solve the aforementioned noise issues. To overcome such noise issues, a third dynamic optical array device 318, e.g., a programmable spatial light modulator, may be included in the collection path pupil plane. The third dynamic optical array device 318 may be coupled to the controller 310 and configured through appropriate programming to filter out unneeded diffraction orders in the collection path before they reach the detector 116.

Figure 2:
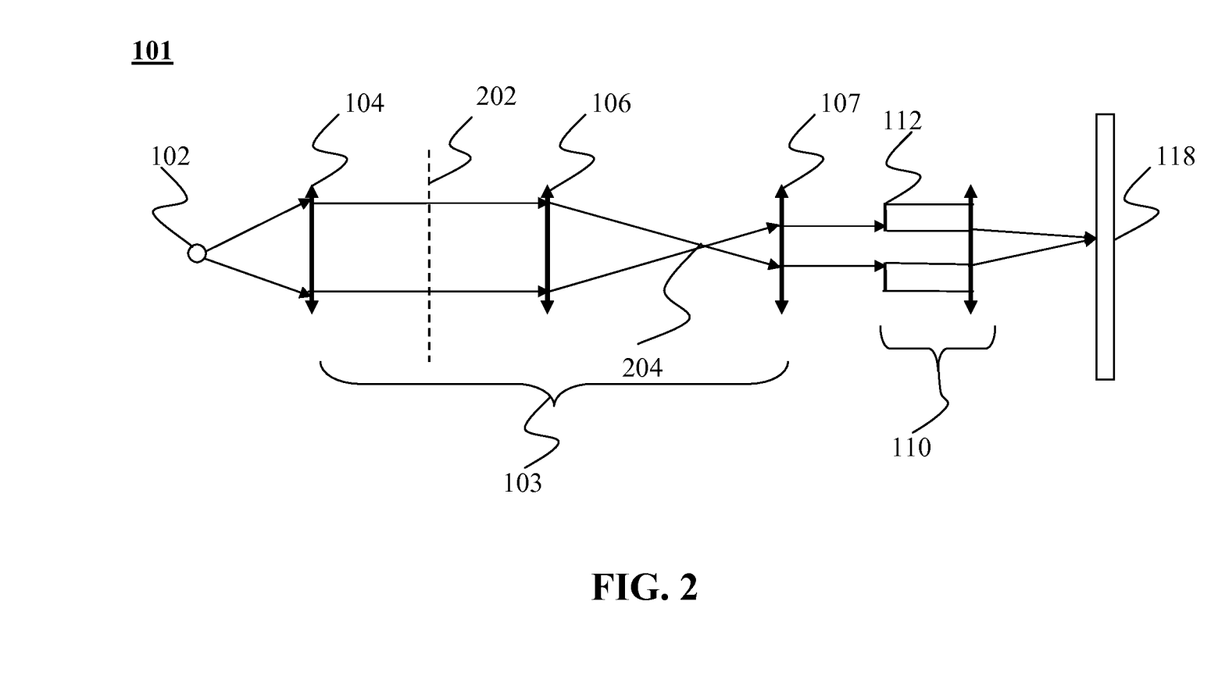
FIG. 2 is a schematic diagram illustrating the illumination optics of the metrology apparatus depicted in FIG. 1.

FIG. 2 is a schematic diagram illustrating the illumination optics 101 of the optical apparatus of FIG. 1. As shown in this figure, optimal pupil conjugate plane 202 and field conjugate plane 204 are predefined in terms of spatial and angular distribution with the pupil conjugate plane 202 positioned between the lenses 104 and 106 and the field conjugate plane 204 positioned between the lens 106 and 107. The pupil conjugate plane is conjugate to a corresponding pupil 112 of the objective 110. The field conjugate plane 204 is conjugate to a field of focus of the objective 110. Preferably, the field of focus is located at the sample 118 when the objective is properly focused.

Figure 3:
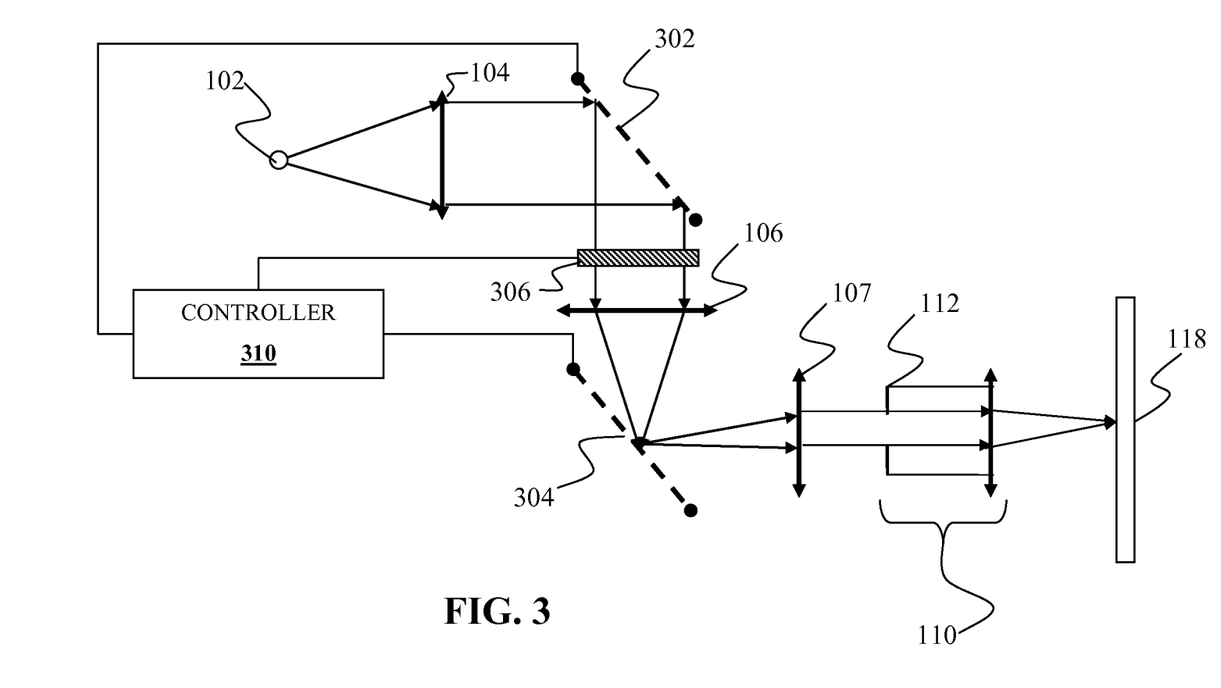
FIG. 3 is a schematic diagram illustrating the illumination aberration control optics according to a preferred embodiment of the present invention.

An implementation of illumination aberration control is illustrated in FIG. 3. The dynamic array devices 302, 304 can be micro-mirror arrays positioned in pupil and field conjugate planes 202, 204 in the illumination path of the system. Each micro-mirror array can include 1-dimensional or 2-dimensional array made up of adjustable micro-mirrors. The angle of each micro-mirror can be controlled, e.g., in response to signals from an electronic controller 310.

The controller 310 can be configured to implement a method for illumination control in the optical system 100. The method may include adjusting a first property of illumination from the source 102 at the pupil conjugate plane 202 using the first dynamic optical array device 302 and adjusting a second property of illumination from the source 102 at the field conjugate plane 204 using the second dynamic optical array device 304. By way of example, the controller 310 may be a general purpose computer having a computer processor 312 and memory 314 and control of the array devices 302, 304 may be implemented executing instructions 316 on the processor 312. The instructions 316 may be stored in the memory or in any suitable non-transitory computer readable medium, such as a read only memory (ROM), CD-ROM, flash memory, floppy disk, and the like. Alternatively, the controller 310 may be implemented in hardware, e.g., by an application specific integrated circuit. The controller 310 may include input/output (I/O) circuits to provide suitable control signals to the array devices 302, 304. The controller 310 may also receive feedback from the detector 116 or any other detector in the system. Such feedback can be useful, e.g., for determining aberrations in the illumination optics 103 and/or collection optics 114 and for adjusting the array devices 302, 304 to counteract such aberrations.

Different combinations of positions for the micro-mirrors in the array can provide different illumination configurations for the system 100. The mirror configurations can also provide a per-pixel distribution of attenuation of the illumination across the pupil conjugate plane 202 or field conjugate plane 204. These configurations can support defining any angular illumination distribution per field point for controlling illumination aberrations. Incident light from the illumination optics 103 illuminates the objective pupil 112 of the objective 110, which directs incident radiation at a feature or features on the sample 118. This light first passed through lenses 104 and directs toward the micro-mirror device 302 located at the pupil conjugate plane. Reflected light from the micro-mirror device 302 is then passed through the lens 106 and directed toward the micro-mirror device 304 positioned at the field conjugate plane. Reflected light from the micro-mirror device 304 arrives at the objective pupil 112 of the objective 110.

The dynamic optical array devices 302, 304 may generally include arrays of individually controllable optical elements that can control the properties of illumination at the pupil conjugate point 202 and field conjugate point 204. By suitably controlling the illumination properties at these conjugate points, the dynamic optical array can optimize the illumination at the objective pupil 112 and at the field of focus at the sample 118. The dynamic optical array devices 302, 304 may include arrays of microelectromechanical system (MEMS) optical elements of a type commonly used in adaptive optics. By way of example, and not by way of limitation, the dynamic optical array devices 302, 304 may include arrays of other types of dynamic optical devices that can adjust some optical property of illumination at the pupil conjugate plane 202 or field conjugate plane 204 on a per-pixel basis. Each dynamic device in the array can be regarded as a pixel. By way of example, alternatives to micro-mirror array devices include, but are not limited to arrays of electronically adjustable polarizing devices (e.g., a liquid crystal array) that can selectively transmit or reflect illumination of a particular polarization on a per-pixel basis, arrays of polarization rotating devices (e.g., an array of Faraday rotators) that can rotate polarization of illumination to a desired orientation on a per-pixel basis, and arrays of spectral filtering devices that can selectively reflect or transmit particular ranges of electromagnetic frequency of illumination on a per-pixel basis. The dynamic optical array devices 302, 304 may also include arrays having combinations of two or more such devices (e.g., an array of wavelength selective polarization rotation devices coupled with polarizers).

The state of each optical element (e.g., micro-mirror) in the array device 302 located at the pupil conjugate plane can be adjusted to produce the required illumination distribution in the pupil. The array device 304 located at the field conjugate plane 204 can similarly adjust the illumination of each field point for correction of the light density. This configuration enables pupil distribution correction for each field point and field distribution correction for each pupil point. By way of example and not by way of limitation, the array devices 302 and 304 can be Digital Micromirror Device (DMD) of the type used for digital light processing (DLP) Technology invented by Texas Instruments, which uses a digital chip to project and display images. DLP chip includes a standard memory cell on top of which is mounted a rectangular array of up to a million hinged, microscopic mirrors. The DMD corrects density of light at the mirror and controls light intensity distribution across the pupil or the field.

The settings of the individual dynamic optical devices in the array devices 302, 304 can be adjusted over a suitable time scale. For example, the detector 116 may collect scattered illumination over a time period referred to herein as a frame. By way of example, and not by way of limitation, a dynamic range of spatial/angular distribution can be achieved by determining the percentage of time during each detector frame that each dynamic optical device in that array devices 302, 304 spends in a certain state. Specifically, in the case of DMD arrays, the controller 310 can individually control the amount of time that each micromirror in each DMD array spends in a reflecting state or a non-reflecting state.

In some embodiments, the system 100 may include additional dynamic optical devices 306, 308 within the source or optically coupled between the source 102 and either of the dynamic optical array devices 302, 304 or between the dynamic optical array devices and the objective 110. The additional dynamic optical devices 306, 308 may be array-type devices or non-array devices having a state that can be controlled in response to signals from the controller 310. The dynamic optical devices 306, 308 may include adjustable optical filters, optical attenuators or adjustable polarization control devices. The controller 310 can time synchronize the state of the dynamic optical devices 306, 308 with the state of each dynamic optical device in the dynamic optical array devices 302, 304. For example, suppose that the first dynamic optical array device 302 is a DMD array and a first dynamical optical device 306 is a (non-array) optical filter and a second dynamic optical device 308 is a (non-array polarization control device. The controller can time synchronize the state of optical filter and polarization control device to coincide with specific reflecting states of specific DMD devices in the array 302 during certain time intervals. In this way illumination having a particular polarization state and wavelength range can be selectively delivered to specific points at the objective pupil 112 and corresponding angles. If the response of the array devices 302, 304 and optical devices 306, 308 is sufficiently fast compared to a detector frame, multiple intensity, wavelength and polarization/spatial—angular illumination distributions can be realized by synchronizing different subsets of the dynamic optic devices in the arrays 302, 304 to different states of the additional optical devices 306, 308 over the course of a detector frame.

By way of example, and not by way of limitation, appropriate settings of the devices that make up the array device 302 at the pupil conjugate plane 202 can control the diameter of the illumination at the objective pupil 112. In particular, devices in the array that are outside the desired diameter can be set to block illumination from reaching the objective pupil and devices that are inside the desired diameter can be set to transmit (or reflect) illumination in such a way that it reaches the objective pupil. The settings of the array device 302 that are used to obtain the desired diameter of illumination can be ported to a different optical system have the same or similar configuration as the system 100 as part of a tool recipe for tool matching of the two systems.

In addition, to control the angular distribution of light hitting the target 118 at each field point the individual devices that make of the array device 302 at the pupil conjugate plane 202 and the individual devices that make of the array device 304 at the field conjugate plane 204 can be set such that a predefined angular distribution reaches every field point. The settings of the array devices 302 and 304 that are used to obtain the desired angular distribution of illumination per field point can be ported to a different optical system have the same or similar configuration as the system 100 as part of a tool recipe for tool matching of the two systems.

The addition of dynamic optical array devices 302, 304 can be used for optimal preparation of the illumination spot to possess predefined angular and spatial distributions with the purpose of canceling out the collection system aberrations. The dynamic properties of these devices also include controlling pupil illumination distribution, such as contrast enhancement etc., illumination aided focusing, and system measurement optimization. The illumination initial condition can be determined by optimizing the illumination field distribution on the target 118 per illuminating pupil point and/or by reducing overall optical aberrations and/or similar methods. Performance errors of the optical system can be calibrated out in training and optimization stages. The optimal operation state of the device can be determined also by detailed electromagnetic simulations of the target that predicts the optimal illumination condition. The dynamic optical array devices 302, 304 can provide an optimal illumination configuration, e.g., by selecting illumination parameters such as numerical aperture (NA), dipole, annular etc. In addition to these known pupil functions, specific angular distribution in the objective pupil 112 can be defined for each such pupil function. Specifically, in addition to forming a predefined pupil illumination intensity distribution function (e.g., donut, dipole, circle, Gaussian intensity distribution . . . ) that determines which pupil point will be illuminated and which pupil point will not be illuminated the angular distribution of the illuminated parts in the objective pupil 112 can be controlled, per pixel, i.e., per pupil point at the objective pupil 112. This additional capability opens up additional degrees of freedom in illumination optimization, contrast enhancement, and the like.

In addition, the dynamic devices 302, 304 can also correct for illumination system imperfections. For example, light from a fiber is not spatially or angularly uniform. The micromirror devices can be configured to correct for these non-uniformities. For example, the array device 302 at the pupil conjugate plane 202 can adjust for non-uniformities in illumination intensity entering the objective pupil 112 by adjusting the amount of light that each element in the array reflects or transmits. In a similar fashion, the array device 304 at the field conjugate plane 204 can adjust for non-uniformities in angular distribution of illumination entering the objective pupil 112 by adjusting the amount of light that each element in the array reflects or transmits.

In certain embodiments of the present invention, the array devices 302, 304 may be configured to compensate for symmetric aberrations in the illumination optics. Such compensation is useful, e.g., for tool matching. As used herein, the term "symmetric aberrations" means optical aberrations, such as phase distortion in the pupil, which has a symmetrical distribution around the optical axis. The main such aberrations are focus and spherical aberrations which usually introduce errors that are related to correctly determining the focus. Furthermore, as these aberrations are spectrally dependent and so is the target response, the resulting focus errors can also vary spectrally. In order to compensate for such aberrations in a coherent system, the optical array device 302 at the pupil conjugate 202 can be configured to introduce phase delays with symmetrical distribution around the pupil center. Such phase delays can potentially be introduced per wavelength range. If the aberrations are field dependent, one can think about a sequence in which one field point is illuminated by the array device 304 at the field conjugate 204 with a first aberration correction by the pupil conjugate array device 302. The following field portion may be illuminated with another aberration compensation by the pupil array device 302 and so on until all of the field is illuminated with corresponding aberration corrections per field point. If the array devices are sufficiently faster than the detector, this process can potentially be accomplished within a single detector frame.

In some embodiments the array device 304 at the field conjugate 204 may operate in synchronization with a rotating polarizer 306 to enable field coding of the polarization state of the illuminating radiation. This architecture can improve performance in cases, e.g., where there are polarizing elements in structures target structures at the sample 118 that induce contrast dependencies.

The polarizer 306 can be located anywhere in the illumination system, preferably in a place where the numerical aperture (NA) is low to avoid angular dependencies. By way of example, and not by way of limitation, the polarizer 306 may be located in some portion of the illumination optics between the array devices 302, 304 in a portion of the illumination optics where the illuminating radiation is collimated.

The synchronization between the rotating polarizer 306 and the array device 304 can be achieved by synchronizing between the polarizer rotation angle and the image selection of the array device.

The addition of dynamic devices in the illumination path as in embodiments of the present invention could be used for spectrum and polarization control as the micro-mirror devices could be operated synchronously with the wavelength and polarization selection options available in the light source or elsewhere. This enables any spatial and angular structure of intensity, wavelength and polarization required for optimal performance.

The addition of dynamic devices in the illumination path as in embodiments of the present invention could be use for any imaging tool with illumination and collection and more generally to any optical device where the quality of illumination or illumination control is important.

In an alternative embodiment, position sensitive detectors (PSD) could be used together with the DMD to optimize illumination (which may be collected with the beam splitter). A PSD can be used in the detection path to determine aberrations in the collecting optics. Alternatively, a phase-sensitive detector (e.g., a Hartmann-Shack phase sensitive detector) also can be used in the detection path for this purpose. Such aberrations may be compensated, e.g., by adjusting the dynamic optical array devices 302, 304 so that the configuration of the illumination of the target 118 tends to reduce or eliminate the measured aberrations in the collecting optics as measured by the PSD or phase-sensitive detector.

The illumination design described above can be used in scatterometery tools. In such cases, it is often desirable to know the polarization distribution in the illumination and it is needed to compensate for problems in polarization distribution. This can be applied to ellipsometry With the ever increasing tightening of optical metrology specifications, illumination system quality becomes a performance bottleneck. Additionally, there is an ever increasing cost of the optics in order to comply with performance. This is even more applicable in the applications requiring contradicting optical specifications. The ability to dynamically control system aberrations via illumination control can contribute to performance and even to an overall cost reduction.

In certain embodiments of the invention, aberration correction per color may be implemented using the array devices 302, 304 for either phase or amplitude. For example to induce a longitudinal chromatic aberration to equalize chromatic defocus across the spectrum.

Figure 4:
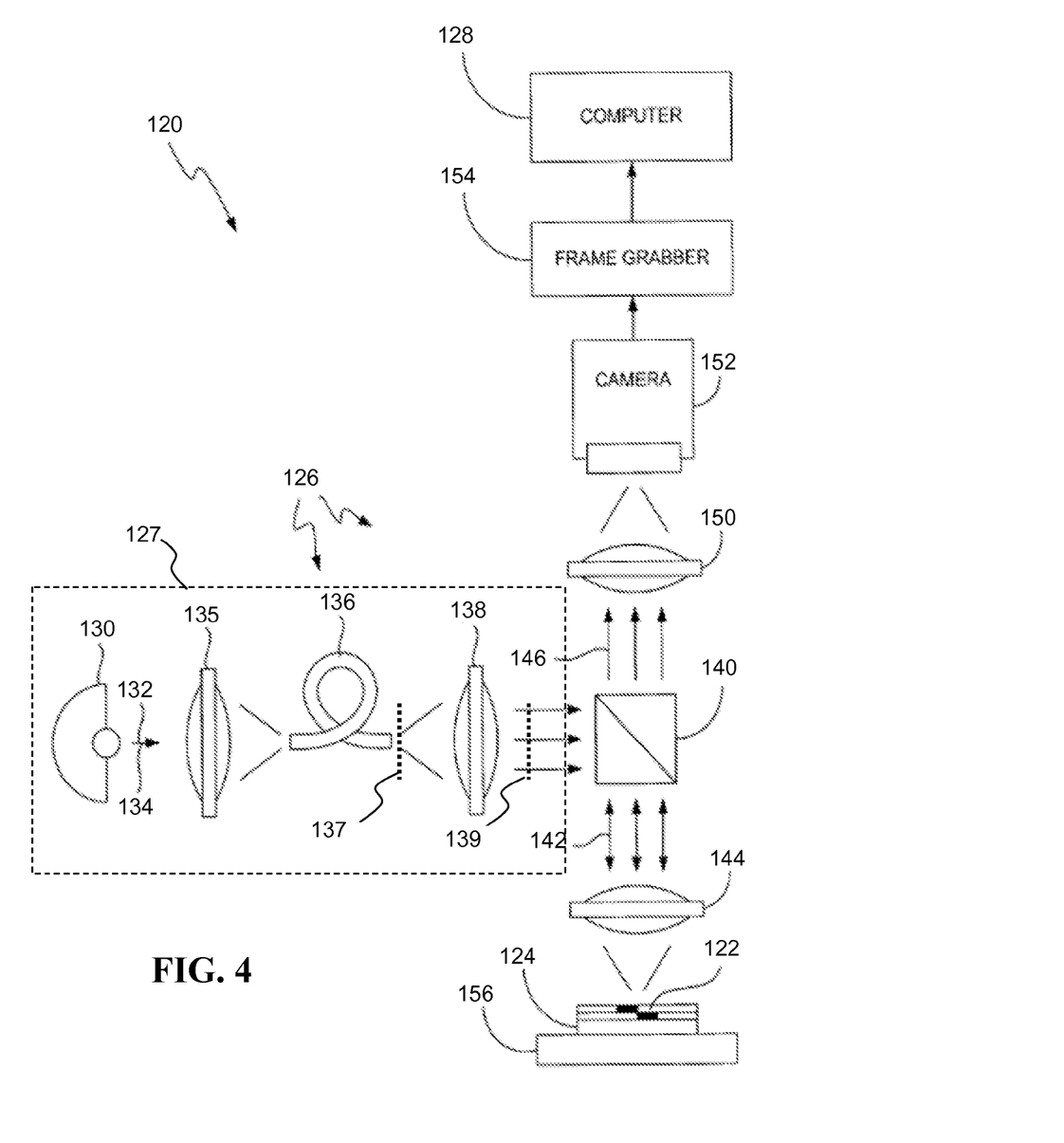
FIG. 4 is a simplified diagram of an overlay measurement system according to an embodiment of the present invention.

Another useful application for embodiments of the present invention is the field of overlay metrology. FIG. 4 is a simplified diagram of an overlay measurement system or metrology tool 120 that may be used to measure overlay in accordance with embodiments of the present invention.

Conventional overlay metrology systems (e.g., imaging or scatterometry), unlike the one depicted in FIG. 4, are typically based on bright field illumination microscopy in which a dedicated metrology target, containing spatial information from at least two separate lithographic exposure steps is imaged onto a two dimensional sensor array. There are a number of shortcomings associated with existing architectures. For example, metrology precision is typically limited by the contrast, generally constrained by the peak to valley difference in the image projection of the lowest contrast target feature. Furthermore, metrology accuracy and tool induced shift performance is also limited by contrast. In addition, in many target architectures, a contrast reversal of an edge or periodic feature may occur when illuminated from different angles of incidence, i.e., from different locations in the illumination pupil. When a target is simultaneously illuminated from multiple angles of incidence the effect of a contrast reversal may be to reduce or even eliminate the contrast entirely of a specific feature when light from multiple angles of incidence on the target are integrated in the image plane.

Current contrast control is based on fixed apertures, and lateral movements of such apertures (e.g. under pzt-control). However, these apertures are binary (on/off). As a result, the only feedback mechanism that is typically available for adjustment of contrast is by adjusting the lateral position of the aperture (or maybe by switching apertures).

In embodiments of the present invention, an dynamic array device, e.g., a programmable spatial light modulator, may be used instead of a mechanical stop in the pupil conjugate plane of the illumination column. This allows the illumination system to implement many different masks in a single dynamic component without having to change the hardware. Moreover, using spatial light modulators enables dynamic apodization rather than just static stops or apodization. The use of a programmable feature also enables future development of illumination pupil masks without hardware change.

Referring again to FIG. 4, the system 120 may be arranged to determine overlay error via one or more overlay targets 122 disposed on a wafer 124. The overlay targets 122 are typically positioned within scribe lines on the wafer 124 that are used for sawing and dicing the wafer into a plurality of dies. The system 120 includes an optical assembly 126 and a computer 128. The optical assembly 126 is generally arranged to capture the images of the overlay target 122. The computer 128 is generally arranged to calculate the relative displacement of the elements of the overlay target from the captured images.

The optical assembly 126 generally includes illumination optics 127 including a light source 130 (e.g., incoherent or coherent, although incoherent is generally preferred) arranged to emit light 132 along a first path 134. The light 132 is made incident on a first lens 135, which focuses the light 132 onto a fiber optic line 136 through which the light 132 passes. Light 132 emerging from fiber optic line 136 then passes through a second lens 138 to collimate the light 132. The collimated light 132 from the illumination optics then continues on to a beam splitter 140 that directs the collimated light onto a path 142 and is made incident on an objective lens 144 that focuses the light 132 onto the wafer 124. A first dynamic optical array element 137 may be placed at a field conjugate of the illumination optics and a second dynamic optical array element 139 may be located at a pupil conjugate of the illumination optics 127. The dynamic optical array elements may operate in response to signals generated in response to instructions executed by the computer 128.

Portions of the light 132 that reflect off of the wafer 124 are then collected by the objective lens 144. Light 132 that leaves the objective 144 continues along path 142 (backwards) until it reaches the beam splitter 140. The beam splitter 140 directs the light 132 onto a path 146. The light 132 continuing on path 146 is then collected by a tube lens 150, which focuses the light 132 onto a camera 152 that records an image of a portion of the wafer 124, and more particularly an image of the target 122. By way of example, the camera 152 may be a charge couple device (CCD), a two-dimensional CCD, or linear CCD array. In most cases, the camera 152 transforms the recorded image into electrical signals, which can be used by, and which are sent to the computer 128. After receiving the electrical signals, the computer 128 performs analysis algorithms that calculate the overlay error of the image. Analysis algorithms will be described in greater detail below.

The system 120 further includes a frame grabber 154 that works with the computer 128 and the camera 152 to grab images of the wafer 124. Although the frame grabber 154 is shown as a separate component, it should be noted that the frame grabber 154 may be part of the computer 128 and/or part of the camera 152. The frame grabber 154 typically has two functions—target acquisition and image grab. During target acquisition, the frame grabber 154 and computer 128 cooperate with a wafer stage 156 to place the target in focus and to position the target as closes as possible to the center of the field of view (FOV) of the metrology tool. In most cases, the frame grabber grabs a plurality of images (e.g., not the images used to measure overlay) and the stage moves the wafer between these grabs until the target is correctly positioned in the X, Y and Z directions. As should be appreciated, the X&Y directions generally correspond to the field of view (FOV) while the Z direction generally corresponds to the focus. Once the frame grabber determines the correct position of the target, the second of these two functions is implemented (e.g., image grab). During image grab, the frame grabber 154 makes a final grab or grabs so as to capture and store the correctly positioned target images, i.e., the images that are used to determine overlay.

After grabbing the images, information must be extracted from the grabbed images to determine the registration error. The extracted information may be digital information or in waveforms. Various algorithms may then be used to determine the registration error between various layers of a semiconductor wafer. For example, a frequency domain based approach, a space domain based approach, Fourier transform algorithms, zero-crossing detection, correlation and cross-correlation algorithms and others may be used.

Algorithms for determining overlay using marks that contain periodic structures can generally be divided into a few groups. For instance, one group may relate to phase retrieval based analysis. Phase retrieval based analysis, which is often referred to as frequency domain based approaches, typically involves creating one dimensional signals by collapsing each of the working zones by summing pixels along the lines of the periodic structure. Examples of phase retrieval algorithms that may be used are described in U.S. Pat. No. 6,023,338 issued to Bareket, U.S. patent application Ser. No. 09/603, 120 filed on Jun. 22, 2000, and U.S. patent application Ser. No. 09/654,318 filed on Sep. 1, 2000, all of which are incorporated herein by reference. Yet another phase retrieval algorithm that may be used is described in U.S. application Ser. No. 09/697,025 filed on Oct. 26, 2000, which is also incorporated herein by reference. The phase retrieval algorithm disclosed therein decomposes signals into a set of harmonics of the basic signal frequency. Quantitative comparison of different harmonics' amplitudes and phases provide important information concerning signals' symmetry and spectral content. In particular, the phase difference between the 1st and 2nd or higher harmonics of the same signal (calibrated with their amplitudes) measures the degree of the signal asymmetry. The major contributions to such asymmetry come from the optical misalignment and illumination asymmetry in the metrology tool (tool induced shifts), as well as process induced structural features (wafer induced shifts). Comparing this misregistration between the phases of the 1st and the 2nd harmonics for the signals acquired from different parts of the field of view on the same process layer may provide independent information about optical aberrations of the metrology tool. Finally, comparing these misregistrations from measurements at a given orientation with those obtained after rotating the wafer 180 degrees allows separation of the tool induced and wafer induced shifts due to asymmetry.

Yet another phase retrieval algorithm that may be used is Wavelet analysis. Wavelet analysis is somewhat similar to that described in the section above, however, now a dynamic window is moved across the one dimensional signal and the phase estimation is carried out in a more localized way. This is particularly of interest with use in the case of a chirped periodic structure. Another group may relate to intensity correlation based methods. In this approach the centers of symmetry for each process layer is found separately by calculating the cross covariance of one signal with the reversed signal from the opposite part of the mark, from the same process layer. This technique is similar to techniques used today with regards to box in box targets.

Embodiments of the present invention may be enhanced through the use of a technique referred to herein as coherence coding. As is generally understood, the term coherence refers to the correlation between physical quantities of a wave. The coherence of two waves follows from how well correlated the waves are as quantified by the cross-correlation function. Coherence coding can be used, e.g., to control the phase relation between different pupil points. Such control may be achieved, e.g., by implementing several pupil function writer images per detector frame, each operating on a beam with a large spatial coherence, such as a beam from a SuperContinuum illuminator. The term spatial coherence describes the ability for two points in space, $x_1$ and $x_2$, in the extent of a wave to interfere, when averaged over time. More precisely, the spatial coherence is conventionally defined as the cross-correlation between two points in a wave for all times. The time over which the cross-correlation diminishes by a significant amount is referred to as the coherence time. The distance the illumination travels during the coherence time is referred to as the coherence length.

When using two optical array devices, e.g., one in a pupil conjugate plane and one in a field conjugate plane, spatial pupil coherence coding may be implemented per field point. Controlling the coherence has an effect on the appearance of the target which in turn is important to the performance. The configuration of a dynamic optical array device located at a pupil conjugate in an illumination system (e.g., array device 302 in FIG. 3) may change several times per detector frame to produce different phase relations between different pupil points. The advantage to this technique is that coherence groups can be summed either coherently or incoherently according to some desired result such as contrast improvement.

Figure 5:
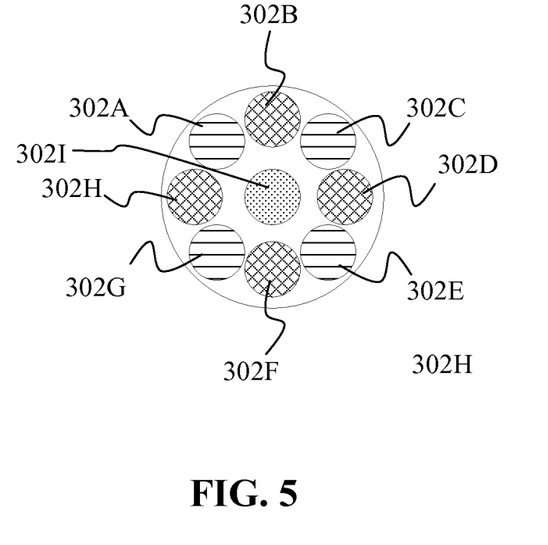
FIG. 5 is a schematic diagram of a pupil plane illustrating an example of coherence coding according to an embodiment of the present invention.

By way of example, the array device 302 and controller 310 of FIG. 1 may be configured so that the array device 302 only transmits the illumination of selected pupil points simultaneously. FIG. 5 shows different portions of the pupil plane through which light is allowed to pass simultaneously over the duration of a detector frame. The term detector frame refers to a period of time over which the detector 116 (e.g., a charge coupled device) gathers a set of data. Portions of the device 302 having the same shading pattern transmit the illumination within a given period of time referred to herein as a pupil frame. This configuration enables control over which portions of the pupil illumination will add up coherently in the image and which portions will add up incoherently. In the example depicted in FIG. 5 there are three different patterns for three different pupil frames. Specifically, portions 302A, 302C, 302E, and 302G transmit illumination simultaneously during a first pupil frame; portions 302B, 302D, 302F, and 302H transmit illumination simultaneously during a second pupil frame; and portion 302I transmits illumination during a third pupil frame.

The short coherence length (or coherence time) of the illumination takes care of the phase relation between different illuminated pupil points. The short coherence time also takes care of the absence of phase correlation with illuminated pupil points of the next pupil frame. Generally, the duration of a pupil frame is longer than the coherence time for the illumination and shorter than the detector frame.

Coherence coding can enhance contrast and is also a prerequisite for coherent polarization coding and coherent phase coding. Coherence coding can also be used to effect suppression in narrow bandwidth illumination. In one implementation the illumination source may be a super-continuum source. As used herein, a super-continuum source generally refers to a source of illumination having a short longitudinal coherence length (e.g., about 2.5µ) and a long spatial coherence, e.g., several millimeters. However, it is noted that coherence coding may be implemented with other broadband sources. The coherence time for such a source may be of order $10^{-14}$ seconds and about $5 \times 10^9$ coherence times per speckle image. If DLP frame duration is 1 millisecond and diffuser images are obtained every 0.05 milliseconds there are 20 speckle realizations per DLP frame. If the detector is a CCD having a frame duration of 30 milliseconds there are 30 DLP frames per CCD field frame. In such a case there will be incoherent summation of coherent DLP contributions.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. An optical system, comprising:
   an objective;
   a source of illumination;
   an illumination system having illumination optics configured to direct the illumination onto the objective; and
   at least two dynamic optical array devices located at a pupil conjugate plane and a field conjugate plane, respectively in the illumination system,
   wherein the dynamic optical array devices are configured to control one or more properties of the illumination coupled from the illumination system to the objective, and
   wherein the dynamic optical array devices include arrays of dynamic optical devices that are configured to adjust an optical property of the illumination at the pupil conjugate plane or field conjugate plane on a per-pixel basis, and include arrays of polarization rotating devices configured to rotate polarization of illumination to a desired orientation on a per-pixel basis, or arrays of spectral filtering devices configured to selectively reflect or transmit particular ranges of electromagnetic frequency of illumination on a per-pixel basis, or
   wherein the source of illumination includes polarization control elements configured to select a polarization state of electromagnetic radiation as a function of wavelength of the illumination.

2. The optical system of claim 1 wherein the objective is configured to focus the illumination onto a target and collect illumination scattered radiation from the target.

3. The optical system of claim 2 further comprising a collection system having collection optics optically coupled to the objective, wherein the collection optics are configured to collect the scattered illumination from the target and couple the scattered illumination to a detector, wherein the dynamic optical array devices are configured to introduce compensating optics aberrations into the illumination system to remove optics aberrations of the collection optics.

4. The system of claim 3, wherein the array device located at the pupil conjugate plane is configured to simultaneously transmit different selected portions of the illumination passing through different corresponding portions of the pupil conjugate plane over a time greater than a coherence time of the illumination and shorter than a detector frame of the detector.

5. The system of claim 3, wherein the collection system includes an additional dynamic optical array device located at a pupil plane of the collection optics.

6. The system of claim 5, wherein the additional dynamic optical array device is configured to filter out unneeded diffraction orders in the collection optics from reaching the detector.

7. The optical system of claim 3 further comprising a position sensitive detector (PSD) array or phase sensitive detector array configured to determine aberrations in the collecting optics.

8. The optical system of claim 7 wherein the PSD array or phase sensitive detector array is located in a collection path.

9. The optical system of claim 1 wherein the dynamic optical array devices include one or more micro-mirror devices.

10. The optical system of claim 9, wherein the micro-mirror device located at the pupil conjugate plane is configured to produce a required illumination distribution in the pupil.

11. The optical system of claim 10, wherein the micro-mirror device located at the field conjugate plane is configured to select the field point for correction of light density.

12. The optical system of claim 11 wherein the micro-mirror device comprises Digital Micro-mirror device (DMD).

13. The optical system of claim 1 wherein the dynamic optical array devices include one or more array devices configured to adjust a distribution of polarization of the illumination across a pupil or field of the optical system.

14. The optical system of claim 1 wherein the dynamic optical array devices are configured to compensate for imperfections in the illumination optics.

15. The optical system of claim 14 wherein the imperfections in the illumination optics include glass inhomogeneity, strae, bubbles, or scratch-dig, roughness.

16. The optical system of claim 1 dynamic optical array device at the pupil conjugate plane is configured to control a diameter of the illumination at a pupil of the objective pupil.

17. The optical system of claim 16 wherein the dynamic array device at the pupil conjugate plane is configured to selectively block illumination from reaching the pupil of the objective or selectively transmit or reflect illumination in such a way that it reaches the pupil of the objective.

18. The optical system of claim 1 wherein the dynamic optical array device at the field conjugate plane is configured to control an angular distribution of the illumination coupled to a target by the objective.

19. The optical system of claim 18 wherein the dynamic optical array device at the field conjugate plane is configured to illuminate only a selected portion of the target with the radiation coupled to the target by the objective.

20. The system of claim 1 wherein the optical property is a per-pixel angular distribution of illumination at the pupil of the objective.

21. The system of claim 1 further comprising a controller coupled to the first or second dynamic optical array device, wherein controller is configured to adjust a percentage of time during a detector frame for which a dynamic optical device within the first or second dynamic optical array device spends in a certain state.

22. The system of claim 21, further comprising an additional dynamic optical device disposed between the dynamic optical device and the source of illumination or between the dynamic optical device and the objective, wherein the controller is configured to synchronize the state of the dynamic optical device with a state of the additional dynamic.

23. The system of claim 22 wherein the additional dynamic optical device is a spectral or polarization control element.

24. The system of claim 1, wherein the optical system is a scatterometry overlay system.

25. The system of claim 1, wherein the optical array devices located at the pupil conjugate and field conjugate are configured to compensate for symmetric aberrations in the illumination optics.

26. The system of claim 1, wherein the illumination system further comprises a rotating polarizer configured to synchronize a polarizing angle of the illumination to an image selected by the array device located at the field conjugate plane.

27. A method for illumination control in an optical system, having an objective, a source of illumination, and illumination optics configured to direct illumination onto the objective, the method comprising:
adjusting a first property of illumination from the source at a pupil conjugate plane using a first dynamic optical array device located at the pupil conjugate plane, wherein the pupil conjugate plane is conjugate to a pupil of the objective; and
adjusting a second property of illumination from the source at a field conjugate plane using a second dynamic optical array device located at the field conjugate plane, wherein the field conjugate plane is conjugate to a field of focus of the objective at a target, and
wherein the first and the second dynamic optical array devices include arrays of dynamic optical devices that configured to adjust an optical property of the illumination at the pupil conjugate plane or field conjugate plane on a per-pixel basis, and include arrays of polarization rotating devices configured to rotate polarization of illumination to a desired orientation on a per-pixel basis, or arrays of spectral filtering devices configured to selectively reflect or transmit particular ranges of electromagnetic frequency of illumination on a per-pixel basis, or wherein the source of illumination includes polarization control elements configured to select a polarization state of electromagnetic radiation as a function of wavelength of the illumination.

28. The method of claim 27 wherein the first property is a diameter of illumination at the pupil conjugate plane.

29. The method of claim 27 wherein the second property is an angular distribution of illumination at the field conjugate plane.

30. The method of claim 27 wherein the first or second property is a per-pixel distribution of illumination attenuation on a per-pixel basis.

31. The method of claim 27 wherein the first or second optical property is a per-pixel spectrum of the illumination.

32. The method of claim 27 wherein the first or second property is a polarization distribution of the illumination.

33. The method of claim 27 wherein the first or second property is a per-pixel angular distribution of illumination at the pupil of the objective.

34. The method of claim 27, further comprising transferring settings of one or more of the dynamic optical array devices to a different optical system to tool match the optical system and the different optical system.

35. The method of claim 27 wherein adjusting the first or second property includes adjusting a percentage of time during a detector frame for which a dynamic optical device within the first or second dynamic optical array device spends in a certain state.

36. The method of claim 27 wherein adjusting the first or second property includes synchronizing the state of each dynamic optical device within the first or second dynamic optical array with a state of an additional dynamic optical device optically coupled to the first or second dynamic optical array device.

37. The method of claim 36 wherein the additional dynamic optical device is a spectral or polarization control element.

38. The method of claim 36 wherein synchronizing the state of each dynamic optical device within the first or second dynamic optical array includes synchronizing different subsets of the dynamic optic devices in the first and second or second dynamic optical array device to different states of the additional optical device over the course of a detector frame.

39. The method of claim 36, wherein synchronizing the state of each dynamic optical device includes synchronizing a polarization angle of the illumination to an image selected by the array device located at the field conjugate plane.

40. The method of claim 27 wherein adjusting the first property includes controlling an angular distribution of illuminated portions of the pupil on a per-pixel basis.

41. The method of claim 27, wherein the optical array devices located at the pupil conjugate and field conjugate are configured to compensate for symmetric aberrations in the illumination optics.

42. A non-transitory computer-readable medium having computer executable instructions embodied therein, wherein the instructions are configured to implement, upon execution, a method for illumination control in an optical system, having an objective, a source of illumination, and illumination optics configured to direct illumination onto the objective, the method comprising:
adjusting a first property of illumination from the source at a pupil conjugate plane using a first dynamic optical array device located at the pupil conjugate plane, wherein the pupil conjugate plane is conjugate to a pupil of the objective; and
adjusting a second property of illumination from the source at a field conjugate plane using a second dynamic optical array device located at the field conjugate plane, wherein the field conjugate plane is conjugate to a field of focus of the objective at a target, and
wherein the first and the second dynamic optical array devices include arrays of dynamic optical devices that configured to adjust an optical property of the illumination at the pupil conjugate plane or field conjugate plane on a per-pixel basis, and include arrays of polarization rotating devices configured to rotate polarization of illumination to a desired orientation on a per-pixel basis, or arrays of spectral filtering devices configured to selectively reflect or transmit particular ranges of electromagnetic frequency of illumination on a per-pixel basis, or wherein the source of illumination includes polarization control elements configured to select a polarization state of electromagnetic radiation as a function of wavelength of the illumination.

* * * * *